United States Patent
Cho

(10) Patent No.: US 9,620,475 B2
(45) Date of Patent: Apr. 11, 2017

(54) ARRAY BASED FABRICATION OF POWER SEMICONDUCTOR PACKAGE WITH INTEGRATED HEAT SPREADER

(71) Applicant: Infineon Technologies Americas Corp., El Segundo, CA (US)

(72) Inventor: Eung San Cho, Torrance, CA (US)

(73) Assignee: Infineon Technologies Americas Corp, El Segundo, CA (US)

( * ) Notice: Subject to any disclaimer, the term of this patent is extended or adjusted under 35 U.S.C. 154(b) by 0 days.

(21) Appl. No.: 14/546,854

(22) Filed: Nov. 18, 2014

(65) Prior Publication Data

US 2015/0162303 A1 Jun. 11, 2015

Related U.S. Application Data

(63) Continuation-in-part of application No. 14/515,720, filed on Oct. 16, 2014, and a continuation-in-part of application No. 14/515,860, filed on Oct. 16, 2014.
(Continued)

(51) Int. Cl.
*H01L 29/15* (2006.01)
*H01L 23/00* (2006.01)
(Continued)

(52) U.S. Cl.
CPC .......... *H01L 24/73* (2013.01); *H01L 23/3121* (2013.01); *H01L 23/4334* (2013.01); *H01L 23/49524* (2013.01); *H01L 23/49562* (2013.01); *H01L 23/49575* (2013.01); *H01L 24/92* (2013.01); *H01L 24/27* (2013.01); *H01L 24/29* (2013.01); *H01L 24/32* (2013.01); *H01L 24/33* (2013.01); *H01L 24/37* (2013.01); *H01L 24/40* (2013.01); *H01L 24/45* (2013.01);
(Continued)

(58) Field of Classification Search
CPC ....... H01L 2924/00; H01L 2224/73265; H01L 2224/32245; H01L 2224/48247; H01L 23/49562; H01L 23/49575; H01L 24/85; H01L 25/165; H01L 24/83; H01L 23/3121; H01L 23/4334; H01L 23/49524; H01L 24/33; H01L 2224/838; H01L 2924/13055; H01L 2924/1306; H01L 2924/13064; H01L 2924/13091; H01L 2924/181
USPC .......................................................... 257/76
See application file for complete search history.

(56) References Cited

U.S. PATENT DOCUMENTS 6,624,522 B2    9/2003  Standing
7,125,747 B2 * 10/2006  Lee ......................... H01L 21/56
                                                                257/E21.502
(Continued)

*Primary Examiner* — Xinning Niu
*Assistant Examiner* — Vu A Vu
(74) *Attorney, Agent, or Firm* — Shumaker & Sieffert, P.A.

(57) ABSTRACT

In one implementation, a method of fabricating a power semiconductor package is disclosed. The method includes providing a conductive carrier array including a plurality of power modules held together with connecting bars, where each of the plurality of power modules includes a control transistor, a sync transistor, and a driver IC. The method further includes overlying on the conductive carrier array a heat spreader array including a plurality of power electrode heat spreaders such that each of the plurality of power electrode heat spreaders couples a drain of the sync transistor to a source of the control transistor in each power module.

20 Claims, 8 Drawing Sheets

Related U.S. Application Data

(60) Provisional application No. 61/913,517, filed on Dec. 9, 2013.

(51) Int. Cl.
*H01L 23/433* (2006.01)
*H01L 23/495* (2006.01)
*H01L 23/31* (2006.01)

(52) U.S. Cl.
CPC .............. *H01L 24/48* (2013.01); *H01L 24/84* (2013.01); *H01L 24/85* (2013.01); *H01L 2224/2732* (2013.01); *H01L 2224/27334* (2013.01); *H01L 2224/27436* (2013.01); *H01L 2224/291* (2013.01); *H01L 2224/293* (2013.01); *H01L 2224/2929* (2013.01); *H01L 2224/29294* (2013.01); *H01L 2224/29295* (2013.01); *H01L 2224/29339* (2013.01); *H01L 2224/32245* (2013.01); *H01L 2224/33181* (2013.01); *H01L 2224/37124* (2013.01); *H01L 2224/37144* (2013.01); *H01L 2224/37147* (2013.01); *H01L 2224/40245* (2013.01); *H01L 2224/45144* (2013.01); *H01L 2224/45147* (2013.01); *H01L 2224/48245* (2013.01); *H01L 2224/73213* (2013.01); *H01L 2224/73215* (2013.01); *H01L 2224/73263* (2013.01); *H01L 2224/73265* (2013.01); *H01L 2224/83* (2013.01); *H01L 2224/83191* (2013.01); *H01L 2224/83424* (2013.01); *H01L 2224/83444* (2013.01); *H01L 2224/83447* (2013.01); *H01L 2224/83851* (2013.01); *H01L 2224/84424* (2013.01); *H01L 2224/84444* (2013.01); *H01L 2224/84447* (2013.01); *H01L 2224/85424* (2013.01); *H01L 2224/85444* (2013.01); *H01L 2224/85447* (2013.01); *H01L 2224/92* (2013.01); *H01L 2224/92246* (2013.01); *H01L 2224/92247* (2013.01); *H01L 2924/1306* (2013.01); *H01L 2924/13055* (2013.01); *H01L 2924/13064* (2013.01); *H01L 2924/13091* (2013.01); *H01L 2924/181* (2013.01)

(56) References Cited

U.S. PATENT DOCUMENTS

| | | | |
|---|---|---|---|
| 7,271,470 | B1 | 9/2007 | Otremba |
| 7,285,849 | B2 | 10/2007 | Cruz |
| 7,301,235 | B2 | 11/2007 | Schaffer |
| 7,663,212 | B2 | 2/2010 | Otremba |
| 7,800,217 | B2 | 9/2010 | Otremba |
| 7,804,131 | B2 | 9/2010 | Cheah et al. |
| 8,138,585 | B2 * | 3/2012 | Liu .............. H01L 23/49524 257/675 |
| 8,304,903 | B2 | 11/2012 | Herbsommer |
| 8,680,656 | B1 | 3/2014 | Kuo |
| 8,884,420 | B1 | 11/2014 | Hosseini |
| 2004/0061221 | A1 | 4/2004 | Schaffer |
| 2006/0017174 | A1 | 1/2006 | Otremba |
| 2006/0151861 | A1 | 7/2006 | Noquil |
| 2007/0090523 | A1 | 4/2007 | Otremba |
| 2007/0114352 | A1 | 5/2007 | Cruz |
| 2009/0224383 | A1 | 9/2009 | Cruz |
| 2010/0133670 | A1 | 6/2010 | Liu |
| 2011/0049690 | A1 * | 3/2011 | Cho .............. H01L 21/4832 257/676 |
| 2012/0015483 | A1 | 1/2012 | Herbsommer |
| 2012/0181674 | A1 | 7/2012 | Cho |
| 2012/0241926 | A1 | 9/2012 | Camacho |
| 2012/0248521 | A1 | 10/2012 | Herbsommer |
| 2012/0280308 | A1 | 11/2012 | Disney |
| 2012/0292752 | A1 * | 11/2012 | Cho .............. H01L 23/3735 257/675 |
| 2012/0292753 | A1 | 11/2012 | Cho |
| 2013/0161801 | A1 | 6/2013 | Otremba |
| 2015/0162261 | A1 | 6/2015 | Cho |

\* cited by examiner

ARRAY BASED FABRICATION OF POWER SEMICONDUCTOR PACKAGE WITH INTEGRATED HEAT SPREADER

The present application claims the benefit of and priority to a provisional application entitled "Array Based Fabrication of Recessed Lead Frame Semiconductor Package with Integrated Heat Spreader," Ser. No. 61/913,517, filed on Dec. 9, 2013. The disclosure in this provisional application is hereby incorporated fully by reference into the present application. The present application is also a continuation-in-part of, and claims the benefit of and priority to parent patent application entitled "Compact Single-Die Power Semiconductor Package," Ser. No. 14/515,720, filed on Oct. 16, 2014. The disclosure in this parent application is hereby incorporated fully by reference into the present application. The present application is also a continuation-in-part of, and claims the benefit of and priority to parent patent application entitled "Compact Multi-Die Power Semiconductor Package," Ser. No. 14/515,860, filed on Oct. 16, 2014. The disclosure in this parent application is also hereby incorporated fully by reference into the present application.

BACKGROUND

For optimization of form factor, performance, and manufacturing cost, it is often desirable to integrate components of a power circuit, such as a half-bridge based DC-DC converter or a voltage converter, in a single semiconductor package. Thus, several semiconductor package designs have been developed to integrate the power transistors of a power circuit within a compact package. To provide sufficient electrical performance for the reliable operation of high power semiconductor packages, it is crucial to ensure high current carrying capability and low resistance for connection between the transistors of the power circuit.

Various high power semiconductor package designs use at least one conductive clip and a separate heat spreader for coupling transistors to a substrate, undesirably increasing electrical resistance and reducing current carrying capability. Additionally, package design rules to successfully accommodate multiple leadframes, a separate heat spreader, and a conductive clip require a large degree of tolerance (i.e. a large clearance space) for manufacturing, thus undesirably increasing package form factor and complexity. For example, package height and width have to be increased to provide sufficient space for the multiple leadframes, the separate heat spreader, and the conductive clip, and additional area on the package may be reserved for necessary electrical connections. Additionally, the increased package complexity resulting from the use of multiple leadframes, the separate heat spreader and the conductive clip may negatively affect manufacturing time, cost, and package yields.

SUMMARY

The present disclosure is directed to array based fabrication of power semiconductor package with integrated heat spreader, substantially as shown in and/or described in connection with at least one of the figures, and as set forth more completely in the claims.

DETAILED DESCRIPTION

Figure 1:
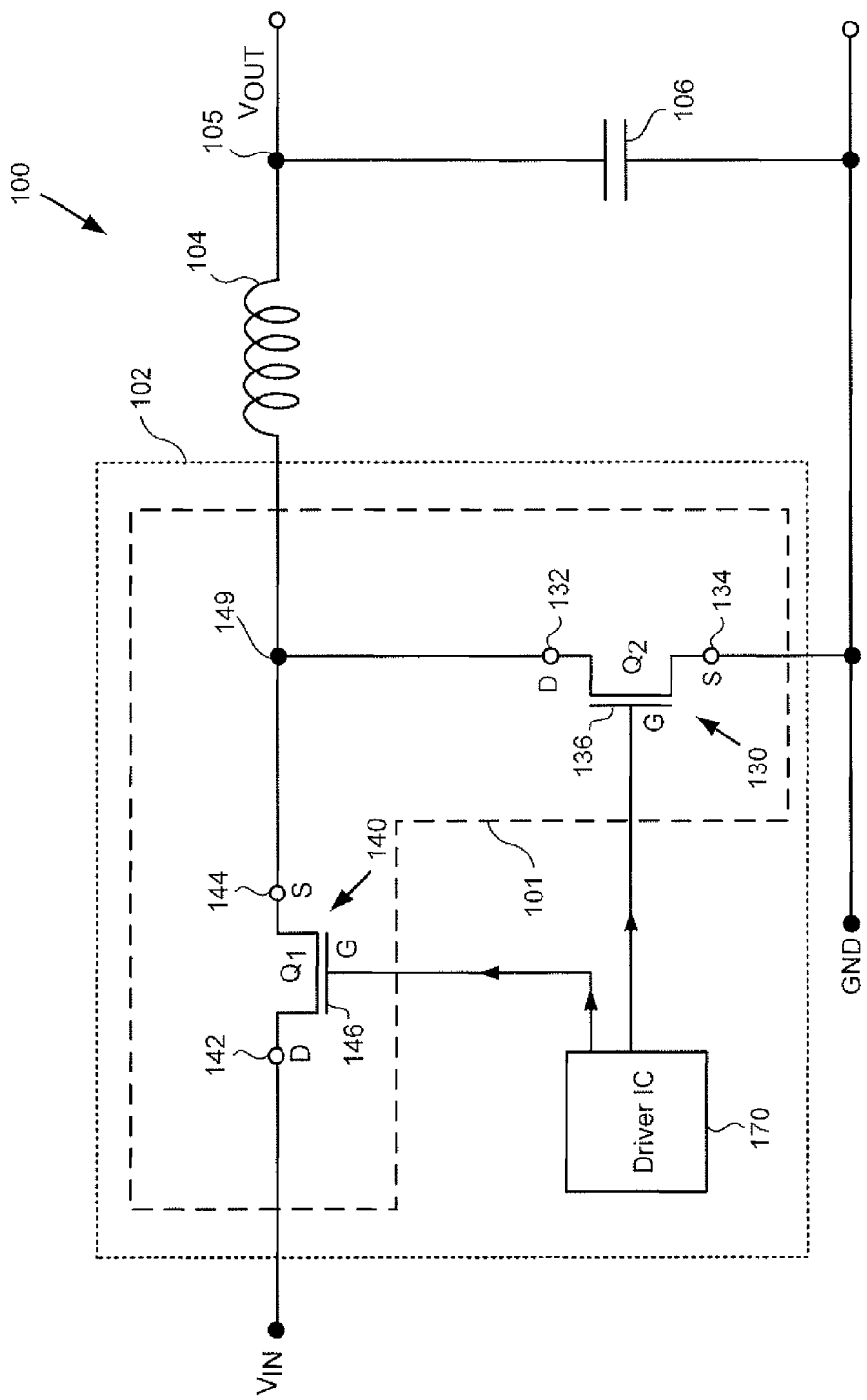
FIG. 1 illustrates a diagram of an exemplary circuit suitable for use as a voltage converter.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Power transistors used in voltage conversion applications are capable of generating substantial heat during operation. The potentially damaging heat can be diverted away from the power transistors using a heat spreader, which in conventional implementations is often relatively large. As a result, packaging solutions for power transistors must typically be sized to accommodate not only the power transistor but also a large heat spreader providing thermal protection for the power transistor.

In addition, due to typical configuration of power transistor electrodes, connection to one of the power electrodes, i.e., source or drain electrode, is typically implemented using a conductive clip formed from a conductive body typically merged with and supported at one end by a downward pointing conductive leg. Due to the high current that must be accommodated by the conductive clip, it is generally desirable that the conductive body and its conductive support leg have a relatively large cross-sectional area. Moreover, because a power transistor can be highly sensitive to electrical resistance, the cross-sectional area of the conductive clip can have a significant effect on device performance.

However, as advances in technology enable implementation of ever thinner power transistors, use of a conductive clip gives rise to conflicting constraints. For example, the permissible thickness of the conductive body portion of a conductive clip can be limited by the height of its support leg. As power transistors are implemented using thinner transistors, the conductive clip support leg requires a reduced height to properly position the conductive body of the conductive clip for contact with a power electrode at a surface of the thinner power transistor. Consequently, the limitation on the thickness of the conductive body of the conductive clip imposed by the reduction in height of the conductive leg of the conductive clip results in a reduction of the effective cross-sectional area of the conductive clip, which can undesirably impair performance.

The present application discloses a packaging solution enabling omission of the aforementioned conductive clip, by integrating its functionality with a heat spreader. The disclosed implementations utilize a conductive carrier, such as a semiconductor package lead frame, having at least one partially etched conductive carrier segment to enable use of a heat spreader to provide a reliable, low resistance, and substantially parasitic free electrical connection. The heat spreader is implemented to provide an electrical coupling of power electrodes of the power transistors to the conductive carrier while concurrently providing thermal protection for the power transistors. In addition, the packaging solution disclosed in the present application includes an array based fabrication technique enabling increased packaging efficiency and reduced packaging cost.

The power transistor package of the present application may be implemented within a voltage converter, for example. Voltage converters are used in a variety of electronic circuits and systems. For example, various applications may require conversion of a direct current (DC) input to a lower, or higher, DC output. As a specific example, a buck converter may be implemented as a voltage regulator to convert a higher voltage DC input to a lower voltage DC output for use in low voltage applications.

FIG. 1 illustrates a diagram of an exemplary circuit suitable for use as a voltage converter. Voltage converter 100 includes voltage converter multi-chip module (MCM) 102, output inductor 104, and output capacitor 106. As shown in FIG. 1, MCM 102 includes power switching stage 101 of voltage converter 100, and driver IC 170 implemented to provide drive signals to power switching stage 101. As shown in FIG. 1, voltage converter 100 is configured to receive an input voltage $V_{IN}$, and to provide a converted voltage, e.g., a rectified and/or stepped down voltage, as $V_{OUT}$ at output 105.

Power switching stage 101 may be implemented using two power transistors in the form of metal-oxide-semiconductor field-effect transistors (MOSFETs) configured as a half bridge, for example. That is to say, power switching stage 101 may include high side or control transistor 140 ($Q_1$) having drain 142, source 144, and gate 146, as well as low side or sync transistor 130 ($Q_2$) having drain 132, source 134, and gate 136. Control transistor 140 is coupled to sync transistor 130 at switch node 149, which, in turn, is coupled to output 105 through output inductor 104. Respective control and sync transistors 140 and 130 may be implemented as field-effect transistors (FETs), insulated gate bipolar transistors (IGBTs), or high electron mobility transistors (HEMTs), for example. More specifically, respective control and sync transistors 140 and 130 may be implemented as silicon FETs or gallium nitride (GaN) FETs. In general, control transistor 140 and sync transistor 130 may be implemented as group IV power transistors, such as silicon power transistors, or as group III-V power transistors, such as GaN power transistors. Voltage converter 100 may be advantageously used, for example as a buck converter, in a variety of automotive, industrial, appliance, and lighting applications.

Figure 4A:
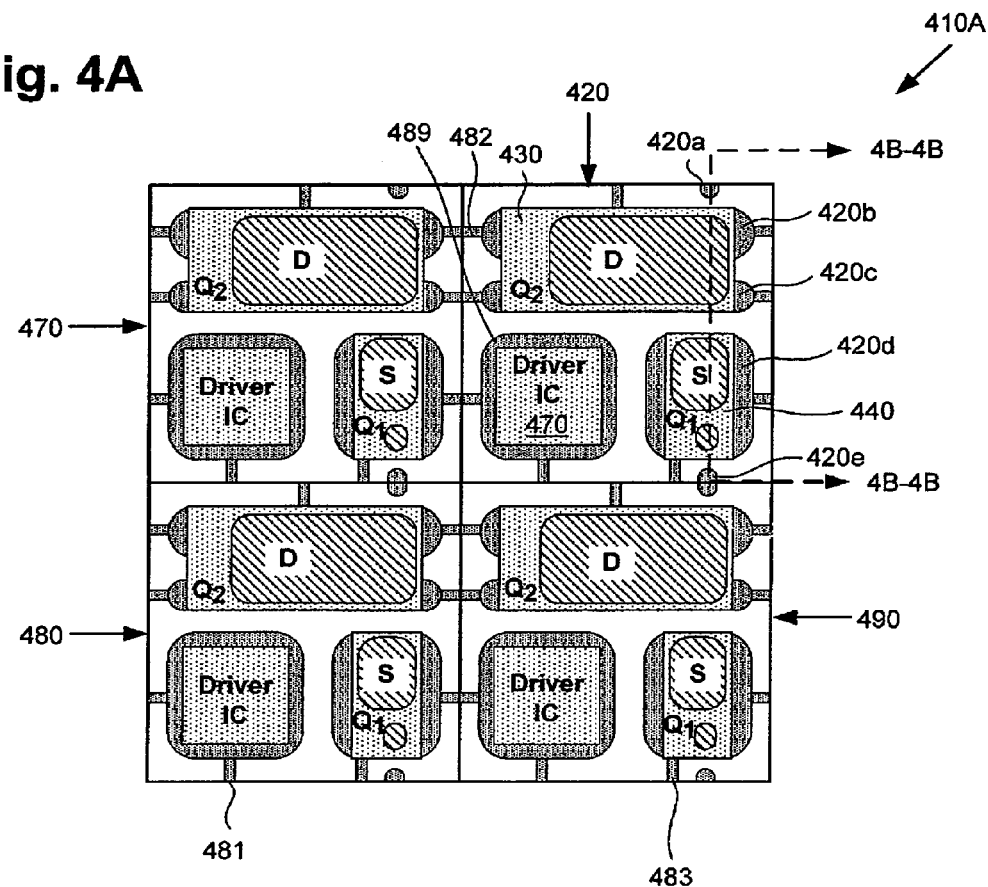
FIG. 4A illustrates a top view of a conductive carrier array according to one implementation of the present disclosure, corresponding to an initial step in the flowchart in FIG. 2.
Figure 4B:
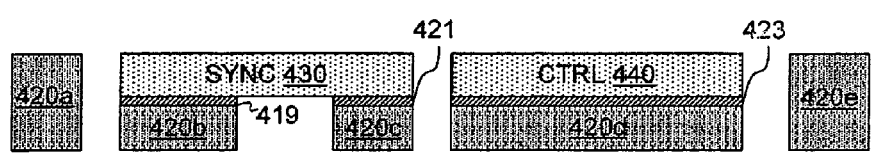
FIG. 4B illustrates one exemplary cross-sectional view of the implementation of the present disclosure shown in FIG. 4A.
Figure 4C:
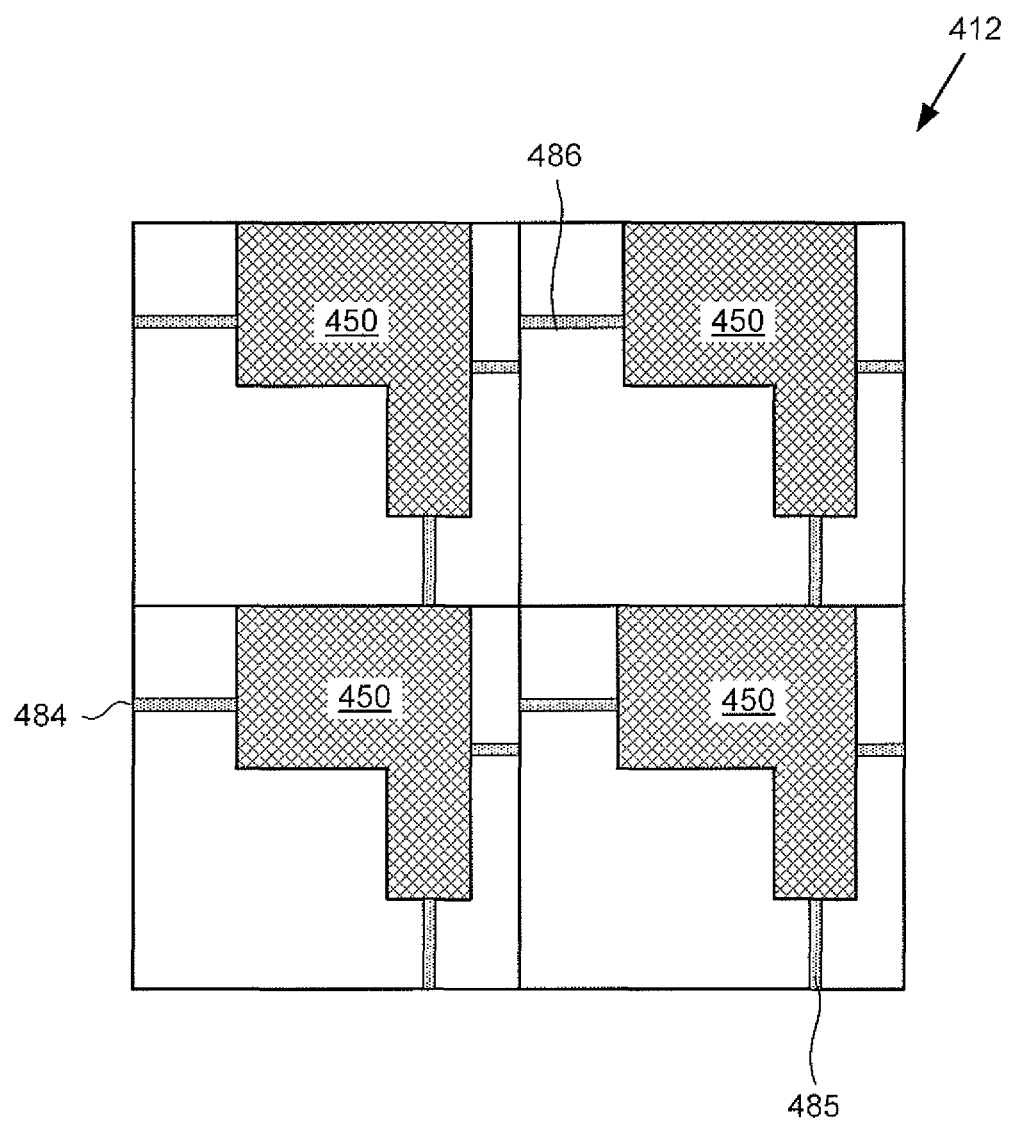
FIG. 4C illustrates a top view of a heat spreader array, corresponding to an intermediate step in the flowchart in FIG. 2.
Figure 4D:
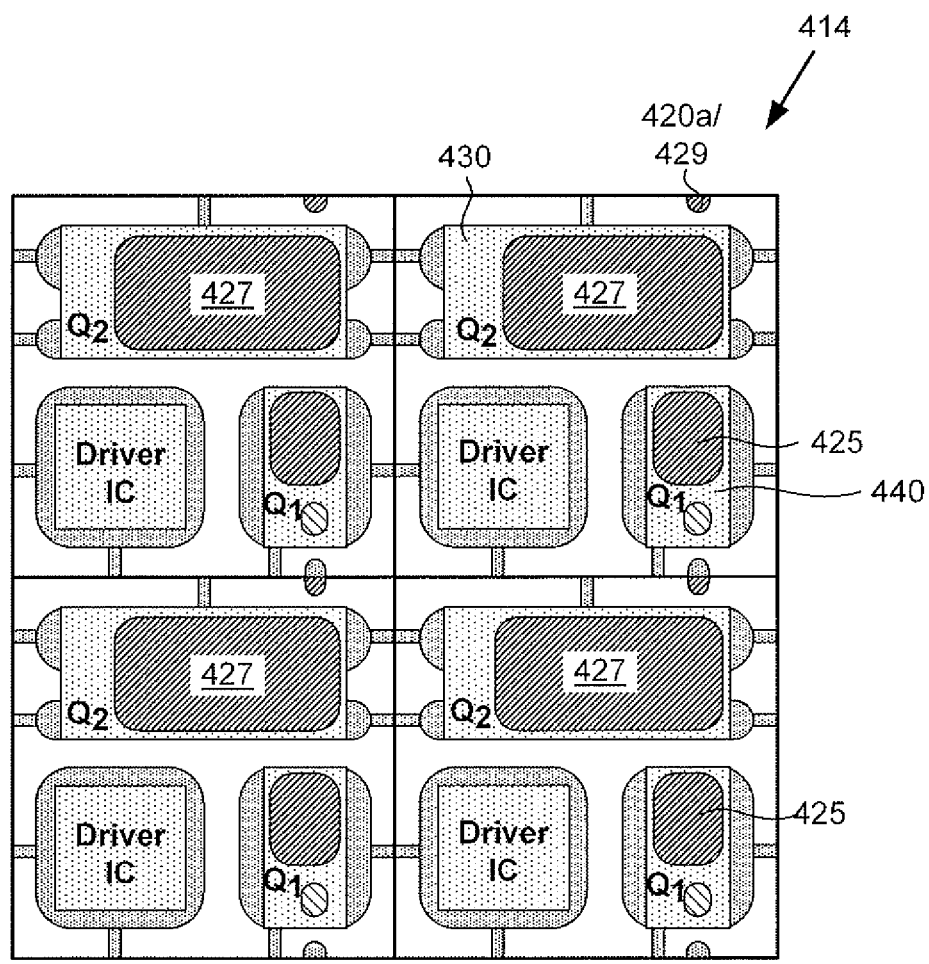
FIG. 4D illustrates a top view of a conductive carrier array according to one implementation of the present disclosure, corresponding to an intermediate step in the flowchart in FIG. 2.
Figure 4E:
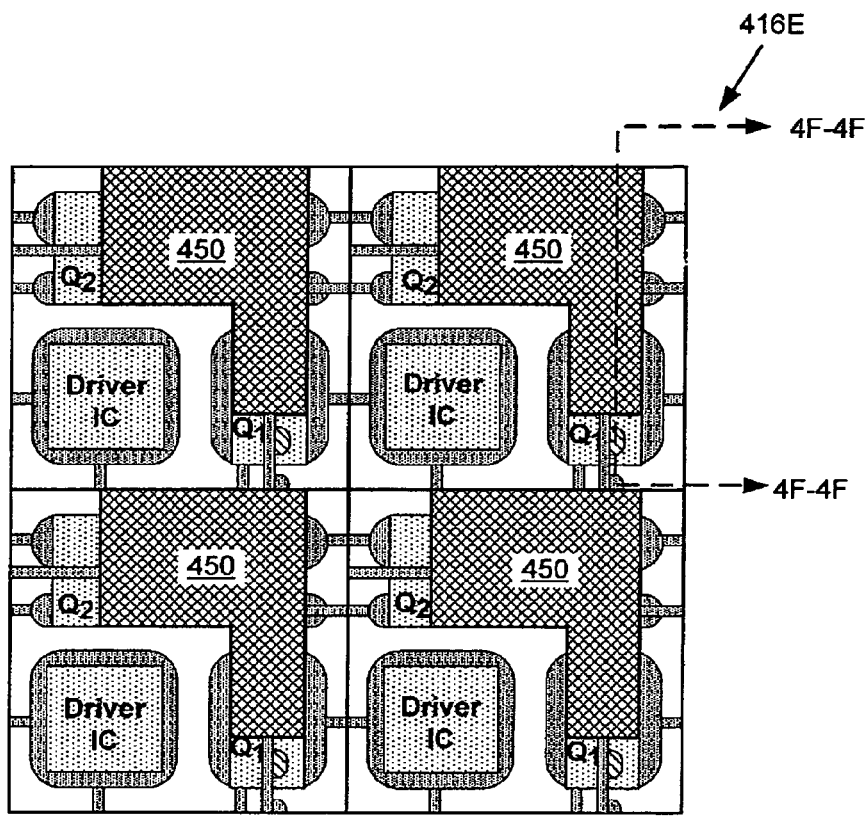
FIG. 4E illustrates a top view of one implementation of the present disclosure, corresponding to an intermediate step in the flowchart in FIG. 2.
Figure 4F:
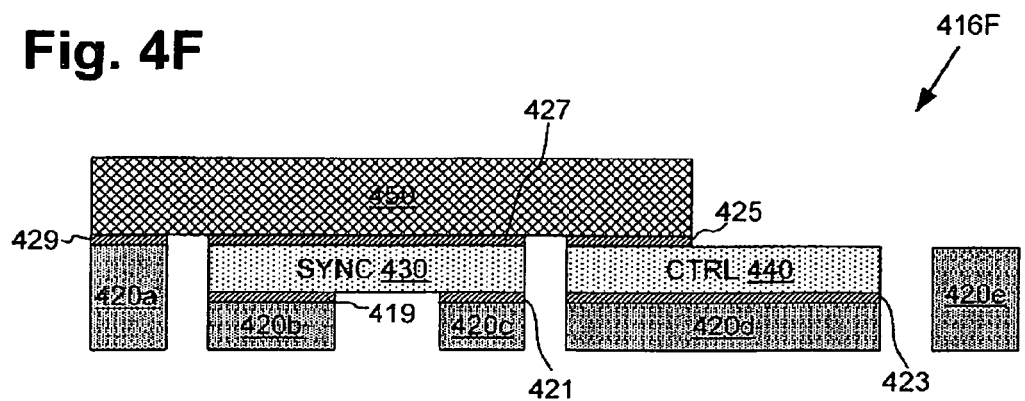
FIG. 4F illustrates one exemplary cross-sectional view of the implementation of the present disclosure shown in FIG. 4E.
Figure 4G:
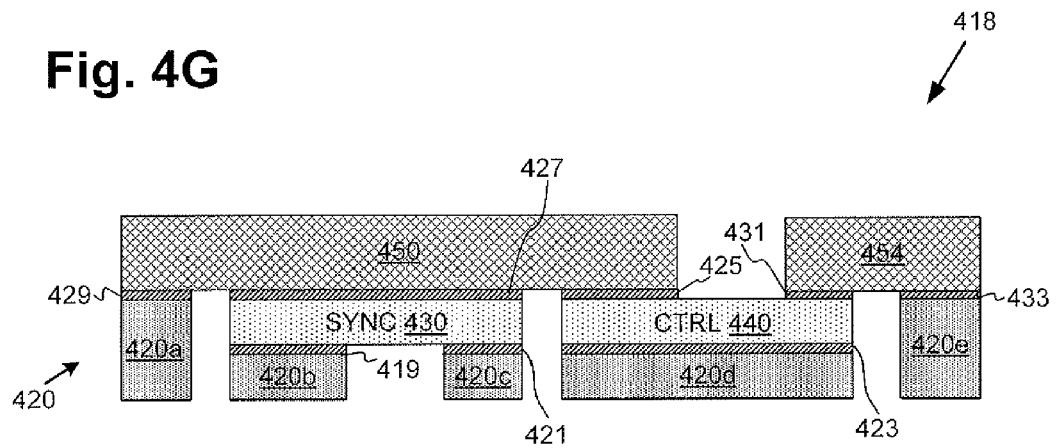
FIG. 4G illustrates a cross-sectional view of one implementation of the present disclosure, corresponding to a final step in the flowchart in FIG. 2.
Figure 4H:
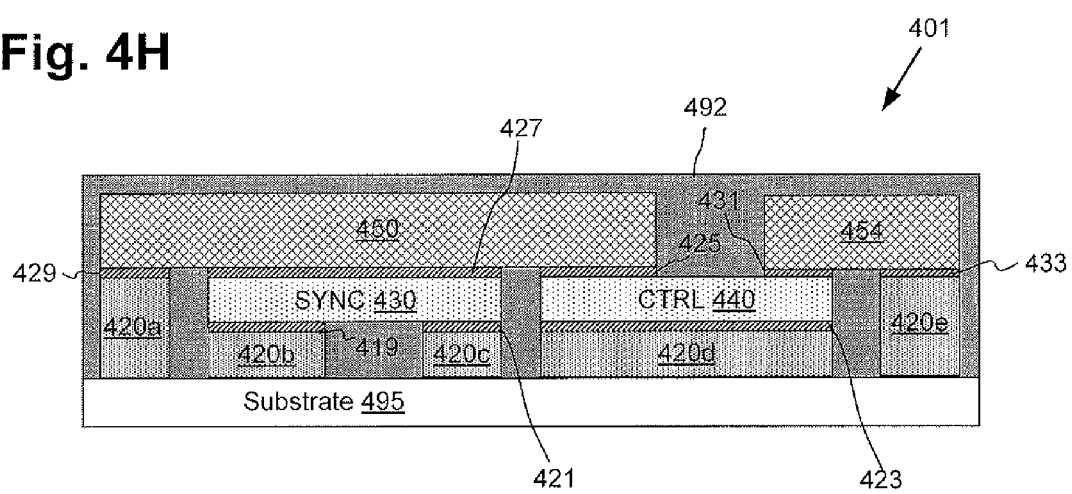
FIG. 4H illustrates a cross-sectional view of another implementation of the present disclosure.

It should be noted with reference to the drawings, that implementations of the present disclosure are described with respect to two power transistors within a power semiconductor package, such as sync transistor 430 and control transistor 440 within power semiconductor package 410B of FIG. 4B, power semiconductor package 416F of FIG. 4F, power semiconductor package 418 of FIG. 4G, and power semiconductor package 401 of FIG. 4H. Each sync transistor 430 may correspond to sync transistor 130 of FIG. 1 and each control transistor 440 may correspond to control transistor 140 of FIG. 1.

It should further be noted that although the implementations illustrated in the present disclosure include both sync transistor 430 and control transistor 440 in a single power semiconductor package, in some implementations it may be advantageous or desirable to package control transistor 440 and sync transistor 430 in separate packages. One of ordinary skill in the art will recognize that the packaging solutions disclosed by the present application may be readily adapted to provide a power semiconductor package with an integrated heat spreader for a single power transistor.

As another example, the sync and control transistors shown in various power semiconductor packages referred to above, such as sync transistor 430 and control transistor 440 within power semiconductor package 410B of FIG. 4B, power semiconductor package 416F of FIG. 4F, power semiconductor package 418 of FIG. 4G, and power semiconductor package 401 of FIG. 4H, may be electrically coupled to a driver IC, an output inductor, and an output capacitor, such as driver IC 170, output inductor 104, and output capacitor 106 of FIG. 1, according to the exemplary voltage converter 100 of FIG. 1.

It should further be noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV based, or group III-V based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

Figure 2:
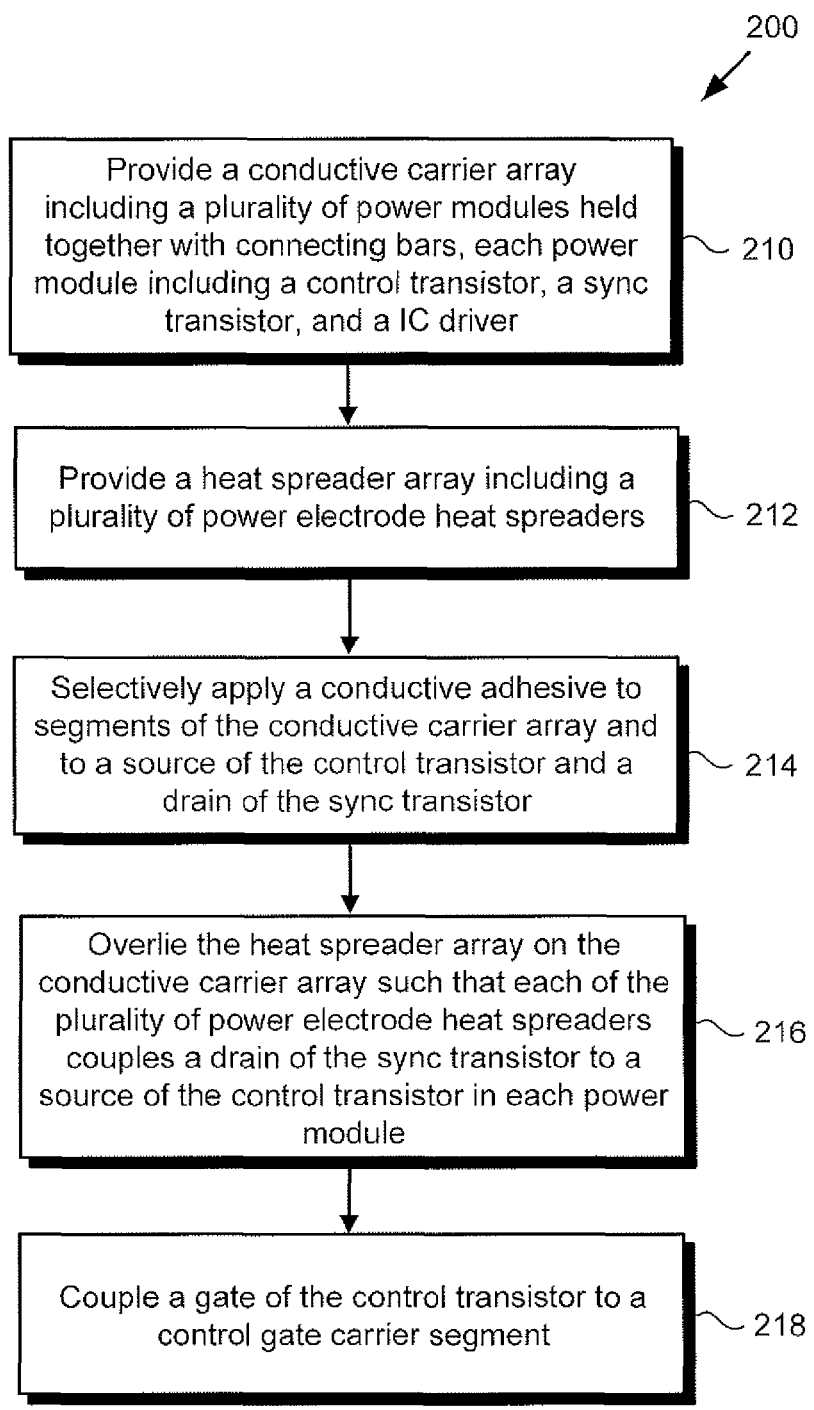
FIG. 2 shows a flowchart illustrating actions taken according to one implementation of the present disclosure.

Referring to FIG. 2, FIG. 2 shows a flowchart illustrating the actions taken according to one implementation of the present disclosure. It is noted that the method described by flowchart 200 is performed on a portion of a conductive carrier structure, which may be a semiconductor package lead frame, or may take the form of a conductive sheet or plate, for example.

With respect to FIGS. 4A, 4C, 4D, 4E, and 4G, the structures shown in those figures illustrate the results of performing various actions according to the method of flowchart 200. For example, FIG. 4A shows a top view after performance of action 210 in providing a conductive carrier array including a plurality of power modules held together with connecting bars, each power module including a control transistor, a sync transistor, and a IC driver, FIG. 4C shows a top view after performance of action 212 in providing a heat spreader array including a plurality of power electrode heat spreaders, and so forth.

Figure 3A:
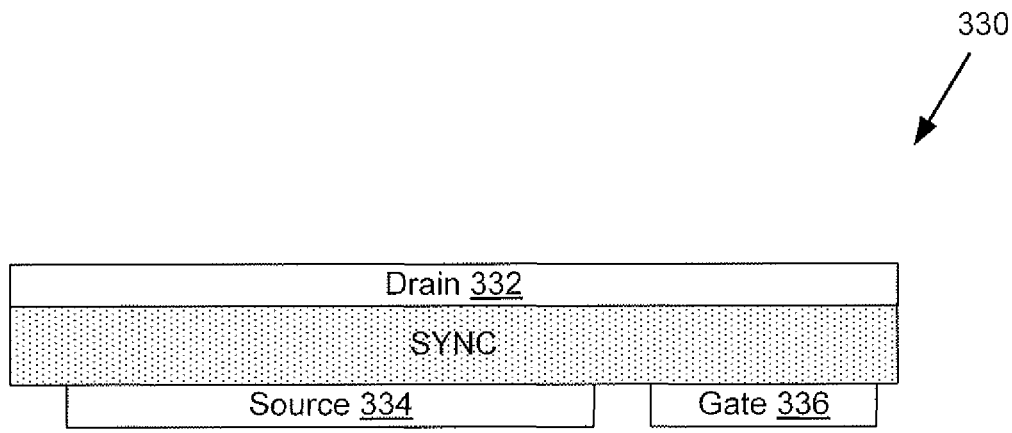
FIG. 3A illustrates a cross-sectional view of a power transistor for use in a power semiconductor package.

FIG. 3A illustrates a simplified cross-sectional view of a power transistor for use in a power semiconductor package. Sync transistor 330 of FIG. 3A includes drain electrode 332, source electrode 334, and gate electrode 336. Drain electrode 332 is a power electrode situated on a top surface of sync transistor 330. Source electrode 334 is a power electrode situated on a bottom surface of sync transistor 330. Gate electrode 336 is a gate electrode situated on the bottom surface of sync transistor 330. In some implementations, sync transistor 430 of FIG. 4A, FIG. 4B, FIG. 4C, FIG. 4D, FIG. 4E, FIG. 4F, FIG. 4G, and FIG. 4H discussed below has the same drain electrode, source electrode, and gate electrode configuration as sync transistor 330 of FIG. 3A. However, the present disclosure is not limited to the implementation of FIG. 3A. For example, in one implementation, the configuration of source electrode 334 and gate electrode 336 of sync transistor 330 may be reversed.

Figure 3B:
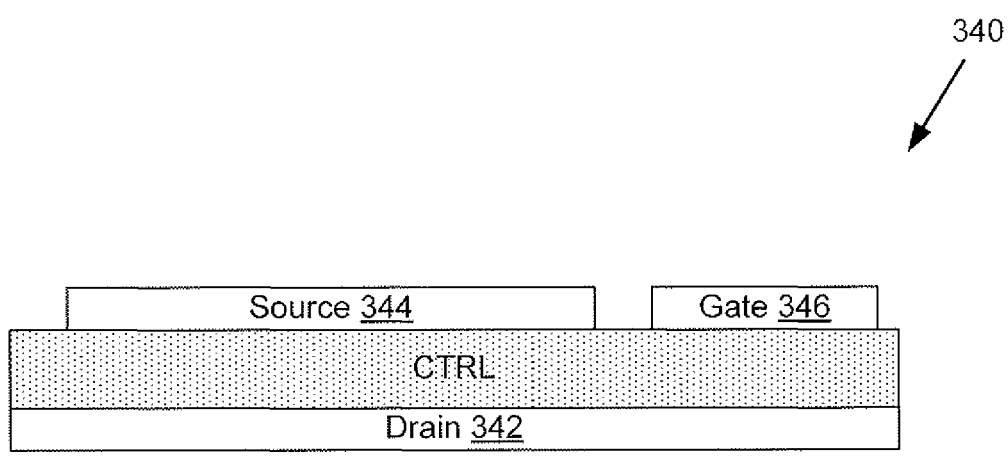
FIG. 3B illustrates a cross-sectional view of another power transistor for use in a power semiconductor package.

FIG. 3B illustrates a simplified cross-sectional view of another power transistor for use in a power semiconductor package. Control transistor 340 of FIG. 3B includes drain electrode 342, source electrode 344, and gate electrode 346. Drain electrode 342 is a power electrode situated on a bottom surface of control transistor 340. Source electrode 344 is a power electrode situated on a top surface of control transistor 340. Gate electrode 346 is a gate electrode situated on the top surface of control transistor 340. In some implementations, control transistor 440 of FIG. 4A, FIG. 4B, FIG. 4C, FIG. 4D, FIG. 4E, FIG. 4F, FIG. 4G, and FIG. 4H discussed below has the same drain electrode, source electrode, and gate electrode configuration as control transistor 340 of FIG. 3B.

Referring to flowchart 200 of FIG. 2, flowchart 200 begins at action 210 with providing a conductive carrier array including a plurality of power modules held together with connecting bars, each power module including a control transistor, a sync transistor, and a IC driver. For example, conductive carrier array 410A of FIG. 4A is provided having power module 420, power module 470, power module 480, and power module 490 held together by connecting bars, such as connecting bars 481, 482, and 483. Each power module 420, power module 470, power module 480, and power module 490 includes sync transistor 430, control transistor 440, and driver IC 470.

Referring to FIG. 4A, conductive carrier array 410A of FIG. 4A includes power module 420, power module 470, power module 480, power module 490, connecting bar 481, connecting bar 482, and connecting bar 483. Each of power module 420, power module 470, power module 480, and power module 490 include sync transistor 430, control transistor 440, driver IC 470, power electrode carrier segment 420a, sync source carrier segment 420b, sync gate carrier segment 420c, control drain carrier segment 420d, control gate carrier segment 420e, and driver IC carrier segment 489. It should be noted that in some implementations, sync transistor 430 and control transistor 440 are implemented using the configurations of sync transistor 330 of FIG. 3A and control transistor 340 of FIG. 3B, respectively.

It should further be noted that conductive carrier array 410A in FIG. 4A is shown as a 2-by-2 array including four power modules merely as an aid in conceptual clarity. In some implementations, conductive carrier array 410A may includes tens, hundreds, or thousands of power modules, including power module 420, power module 470, power module 480, and power module 490. Moreover, although conductive carrier array 410A of FIG. 4A is illustrated with a square geometry, other implementations may utilize other geometries, including a rectangular geometry, for example.

Together, each collection of power electrode carrier segment 420a, sync source carrier segment 420b, sync gate carrier segment 420c, control drain carrier segment 420d, control gate carrier segment 420e, and driver IC carrier segment 489 form a conductive carrier for each power module 420, power module 470, power module 480, and power module 490. The conductive carrier may be a semiconductor package lead frame, or may take the form of a conductive sheet or plate, for example. The conductive carrier may be a fully patterned conductive carrier formed of any conductive material having a suitably low electrical resistance. The conductive carrier is configured to sink heat from sync transistor 430 and control transistor 440 into a substrate, for example. Each of power electrode carrier segment 420a, sync source carrier segment 420b, sync gate carrier segment 420c, control drain carrier segment 420d, control gate carrier segment 420e, and driver IC carrier segment 489 may include copper (Cu), aluminum (Al), or a conductive alloy, for example.

Each of power module 420, power module 470, power module 480, and power module 490 further include driver IC 470. In some implementations, driver IC 470 may correspond to driver IC 170 of FIG. 1. In such an implementation, each of power module 420, power module 470, power module 480, and power module 490 may be configured according to multi-chip module (MCM) 102 of voltage converter 100 of FIG. 1 such that each power module 420, power module 470, power module 480, and power module 490 includes driver IC 470, sync transistor 430, control transistor 440, and a switch node corresponding to driver IC 170, sync transistor 130, control transistor 140, and switch node 149 of FIG. 1.

However, in some implementations, driver IC 470 may not be included in each of power module 420, power module 470, power module 480, and power module 490. In such an implementation, each of power module 420, power module 470, power module 480, and power module 490 may be configured according to power switching stage 101 of voltage converter circuit 100 of FIG. 1 such that each power module 420, power module 470, power module 480, and power module 490 includes sync transistor 430, control transistor 440, and a switch node corresponding to sync transistor 130, control transistor 140, and switch node 149 of FIG. 1.

The connecting bars of conductive carrier array 410A, including connecting bars 481, 482, and 483 are configured to hold together each power module 420, power module 470, power module 480, and power module 490. For example, connecting bar 482 holds together control sync transistor 430 of power module 420 and power module 470. During singulation of each power module 420, power module 470, power module 480, and power module 490, connecting bar 482 is cut along the line dividing power module 420 and power module 470, for example. After singulation, the connecting bars may provide electrical connections for each power module 420, power module 470, power module 480, and power module 490. For example, connecting bar 482 may provide electrical connection for the source of sync transistor 430, connecting bar 481 may provide electrical connection for driver IC 470, and connecting bar 483 may provide electrical connection for the drain of control transistor 440. Each of the connecting bars, including connecting bar 481, connecting bar 482, and connecting bar 483 may include copper (Cu), aluminum (Al), or a conductive alloy, for example.

Referring to FIG. 4B, FIG. 4B illustrates a cross-sectional view of a power module according to one implementation of the present disclosure. More specifically, power module 410B of FIG. 4B illustrates a cross-sectional view of power module 420 along dashed lines 4B-4B of FIG. 4A. Power module 410B of FIG. 4B includes sync transistor 430, control transistor 440, power electrode carrier segment 420a, sync source carrier segment 420b, sync gate carrier segment 420c, control drain carrier segment 420d, control gate carrier segment 420e, conductive adhesive 419, conductive adhesive 421, and conductive adhesive 423. It should be noted that in some implementations, sync transistor 430 and control transistor 440 are implemented using the configurations of sync transistor 330 of FIG. 3A and control transistor 340 of FIG. 3B, respectively.

Sync transistor 430 of power module 410B is configured to be coupled to sync source carrier segment 420b and sync gate carrier segment 420c. More specifically, sync transistor 430 is configured to be electrically and mechanically coupled to sync source carrier segment 420b using conductive adhesive 419 and electrically and mechanically coupled to sync gate carrier segment 420c using conductive adhesive 421. In one implementation, sync transistor 430 may take the form of group IV material based FET, such as a silicon metal-oxide-semiconductor FET (MOSFET), for example. However, in other implementations, sync transistor 430 may take the form of group III-V based power FET, such as a GaN or other III-Nitride based FET. As discussed above in reference to FIG. 1, sync transistor 430 may be implemented as sync transistor 130 according to voltage converter 100 of FIG. 1.

Control transistor 440 of power module 410B is configured to be coupled to control drain carrier segment 420d. More specifically, control transistor 440 is configured to be electrically and mechanically coupled to control drain carrier segment 420d using conductive adhesive 423. In one implementation, control transistor 440 may take the form of group IV material based FET, such as a silicon metal-oxide-semiconductor FET (MOSFET), for example. However, in other implementations, control transistor 440 may take the form of group III-V based power FET, such as a GaN or other III-Nitride based FET. As discussed above in reference to FIG. 1, control transistor 440 may be implemented as control transistor 140 according to voltage converter 100 of FIG. 1.

Sync source carrier segment 420b of power module 410B is configured to be electrically and mechanically coupled to sync transistor 430 using conductive adhesive 419. More specifically, in an implementation where sync transistor 430 has the configuration of sync transistor 330 of FIG. 3A, sync source carrier segment 420b is configured to be electrically and mechanically coupled to the source electrode of sync transistor 430, such as source electrode 334 of FIG. 3A.

Sync gate carrier segment 420c of power module 410B is configured to be electrically and mechanically coupled to sync transistor 430 using conductive adhesive 421. More specifically, in an implementation where sync transistor 430 has the configuration of sync transistor 330 of FIG. 3A, sync gate carrier segment 420c is configured to be electrically and mechanically coupled to the gate electrode of sync transistor 430, such as gate electrode 336 of FIG. 3A.

Control drain carrier segment 420d of power module 410B is configured to be electrically and mechanically coupled to control transistor 440 using conductive adhesive 423. More specifically, in an implementation where control transistor 440 has the configuration of control transistor 340 of FIG. 3B, control drain carrier segment 420d is configured to be electrically and mechanically coupled to the drain electrode of control transistor 440, such as drain electrode 342 of FIG. 3B.

Sync source carrier segment 420b, sync gate carrier segment 420c, and control drain carrier segment 420d may be fabricated using a partial etch performed on a top and/or a bottom surface of sync source carrier segment 420b, sync gate carrier segment 420c, and control drain carrier segment 420d, for example. In some implementations, sync source carrier segment 420b, sync gate carrier segment 420c, and control drain carrier segment 420d may be fabricated by performing a half-etch, for example. In such an implementation, sync source carrier segment 420b, sync gate carrier segment 420c, and control drain carrier segment 420d may be half the thickness of power electrode carrier segment 420a and control gate carrier segment 420e.

Although not shown in the present drawings, in some implementations, power electrode carrier segment 420a, sync source carrier segment 420b, sync gate carrier segment 420c, control drain carrier segment 420d, and control gate carrier segment 420e may include a barrier metal layer formed on a top and/or a bottom surface. The barrier metal layer may include nickel-gold (NiAu) or nickel-palladium-gold (NiPdAu), for example. In some implementations, the barrier metal layer may serve as an etching mask during patterning of power electrode carrier segment 420a, sync source carrier segment 420b, sync gate carrier segment 420c, control drain carrier segment 420d, and control gate carrier segment 420e, for example.

Referring again to flowchart 200 of FIG. 2, flowchart 200 continues at action 212 with providing a heat spreader array including a plurality of power electrode heat spreaders. For example, heat spreader array 412 of FIG. 4C is provided including power electrode heat spreaders 450. Referring to FIG. 4C, heat spreader array 412 of FIG. 4C includes power electrode heat spreaders 450, connecting bar 484, connecting bar 485, and connecting bar 486.

Power electrode heat spreaders 450 are each configured for attachment to a respective power module 420, power module 470, power module 480, and power module 490 of FIG. 4A. For example, power electrode heat spreader 450 in the upper right of heat spreader array 412 including connecting bar 486 is configured for attachment to power module 420, power electrode heat spreader 450 in the lower right of heat spreader array 412 including connecting bar 485 is configured for attachment to power module 490, and so forth. Power electrode heat spreaders 450 may include Cu or Al, for example, or may include a conductive alloy.

The connecting bars of heat spreader array 412, including connecting bar 484, connecting bar 485, and connecting bar 486, are configured to hold together heat spreader array 412 and may be configured for electrical connection of power electrode heat spreaders 450, similar to connecting bar 481, connecting bar 482, and connecting bar 483 of FIG. 4A. Each of the connecting bars, including connecting bar 484, connecting bar 485, and connecting bar 486 may include Cu, aluminum Al, or a conductive alloy, for example.

Referring again to flowchart 200 of FIG. 2, flowchart 200 continues at action 214 with selectively applying a conductive adhesive to segments of the conductive carrier array and to a source of the control transistor and a drain of the sync transistor. For example, conductive carrier array 414 of FIG. 4D includes conductive carrier array 410A of FIG. 4A after selectively applying conductive adhesive 429 to power electrode carrier segment 420a, conductive adhesive 427 to the drain of sync transistor 430, and conductive adhesive 425 to the source of control transistor 440.

Each of conductive adhesive 425, conductive adhesive 427, and conductive adhesive 429 are configured to electrically and mechanically couple each of power electrode heat spreaders 450 of FIG. 4C to its respective power module 420, power module 470, power module 480, and power module 490 of FIG. 4A.

Due to the use of a array based approach of fabrication in the present disclosure, each of conductive adhesive 425, conductive adhesive 427, and conductive adhesive 429 may be applied in a single processing step. In one implementation, each of conductive adhesive 425, conductive adhesive 427, and conductive adhesive 429 may be applied substantially concurrently, by using a screen printing technique, for example. In such an implementation, conductive adhesive 425, conductive adhesive 427, and conductive adhesive 429 may be selected based on their suitability for application in a screen printing or other substantially concurrent application process.

Conductive adhesive 425, conductive adhesive 427, and conductive adhesive 429 may include a conductive adhesive material, a solder paste, solder tape, solder, a silver filled adhesive such as QMI 529HT, a conductive sintered material, a diffusion bonded material, or another suitable attachment means. Conductive adhesive 425, conductive adhesive 427, and conductive adhesive 429 may be formed to a thickness of at least 10 µm, for example.

Referring again to flowchart 200 of FIG. 2, flowchart 200 continues at action 216 with overlying the heat spreader array on the conductive carrier array such that each of the plurality of power electrode heat spreaders couples the drain of the sync transistor to the source of the control transistor in each power module. For example, power semiconductor package array 416E of FIG. 4E includes conductive carrier array 414 of FIG. 4D after overlying heat spreader array 412 of FIG. 4C such that each of power electrode heat spreaders 450 couples the drain of sync transistor 430 to the source of control transistor 440 in each power module 420, power module 470, power module 480, and power module 490.

Power electrode heat spreader 450 may have an "L" shape, as illustrated in FIG. 4C and FIG. 4E, or power electrode heat spreader 450 may have a different shape to cover more or less space on control transistor 440 and sync transistor 430 depending on the current carrying capability and thermal dissipation requirements of power electrode heat spreader 450.

Referring to FIG. 4F, FIG. 4F illustrates a cross-sectional view of one implementation of the present disclosure. More specifically, power semiconductor package 416F of FIG. 4F illustrates a cross-sectional view along dashed lines 4F-4F of FIG. 4E. For example, power semiconductor package 416F includes power module 410B of FIG. 4B after coupling power electrode heat spreader 450 to power electrode carrier segment 420a, sync transistor 430, and control transistor 440.

Power semiconductor package 416F of FIG. 4F includes power electrode heat spreader 450, sync transistor 430, control transistor 440, power electrode carrier segment 420a, sync source carrier segment 420b, sync gate carrier segment 420c, control drain carrier segment 420d, control gate carrier segment 420e, conductive adhesive 419, conductive adhesive 421, and conductive adhesive 423, conductive adhesive 425, conductive adhesive 427, and conductive adhesive 429. It should be noted that in some implementations, sync transistor 430 and control transistor 440 are implemented using the configurations of sync transistor 330 of FIG. 3A and control transistor 340 of FIG. 3B, respectively.

Power electrode heat spreader 450 is configured to be situated over and couple the drain electrode of sync transistor 430 to the source electrode of control transistor 440. As such, power electrode heat spreader 450 is configured to provide switch node contact 149 according to voltage converter 100 of FIG. 1. Power electrode heat spreader 450 is further configured to be situated over and coupled to power electrode carrier segment 420a. More specifically, power electrode heat spreader 450 is configured to be electrically and mechanically coupled to the source electrode of control transistor 440 using conductive adhesive 425, the drain electrode of sync transistor 430 using conductive adhesive 427, and power electrode carrier segment 420a using conductive adhesive 429.

Power electrode heat spreader 450 may be a flat, electrically and thermally conductive body, having a substantially planar bottom for attachment to sync transistor 430, control transistor 440, and power electrode carrier segment 420a. Power electrode heat spreader 450 may include Cu, Al, a conductive alloy, or another suitable conductive material, for example.

In addition to coupling the drain electrode of sync transistor 430 to the source electrode of control transistor 440, power electrode heat spreader 450 is configured to provide integrated heat spreading functionality for dissipation of heat generated by sync transistor 430 and control transistor 440. Power electrode heat spreader 450 provides the above functions without the need for a conductive clip including a leg portion, and without the need for a separate heat spreader.

Power electrode carrier segment 420a is configured to be electrically and mechanically coupled to power electrode heat spreader 450 using conductive adhesive 429. Power electrode carrier segment 420a is further configured to electrically couple the drain electrode of sync transistor 430 and the source electrode of control transistor 440 to a substrate, for example.

Referring again to flowchart 200 of FIG. 2, flowchart 200 continues at action 218 with coupling a gate of the control transistor to a control gate carrier segment. For example, power semiconductor package 418 of FIG. 4G includes power semiconductor package 416F of FIG. 4F after coupling gate electrode heat spreader 454 to control gate carrier segment 420e.

Referring to FIG. 4G, power semiconductor package 418 of FIG. 4G includes power electrode heat spreader 450, gate electrode heat spreader 454, sync transistor 430, control transistor 440, power electrode carrier segment 420a, sync source carrier segment 420b, sync gate carrier segment 420c, control drain carrier segment 420d, control gate carrier segment 420e, conductive adhesive 419, conductive adhesive 421, and conductive adhesive 423, conductive adhesive 425, conductive adhesive 427, conductive adhesive 429, conductive adhesive 431, and conductive adhesive 433. It should be noted that in some implementations, sync transistor 430 and control transistor 440 are implemented using the configurations of sync transistor 330 of FIG. 3A and control transistor 340 of FIG. 3B, respectively.

Gate electrode heat spreader 454 is configured to be situated over and couple the gate electrode of control transistor 440 to control gate carrier segment 420e. More specifically, gate electrode heat spreader 454 is configured to be electrically and mechanically coupled to the gate electrode of control transistor 440 using conductive adhesive 431 and to control gate carrier segment 420e using conductive adhesive 433.

Gate electrode heat spreader 454 may be a flat, electrically and thermally conductive body, having a substantially planar bottom for attachment to control transistor 440 and control gate carrier segment 420e. Gate electrode heat spreader 454 may be substantially the same thickness as power electrode heat spreader 450. Gate electrode heat spreader 454 may include Cu, Al, a conductive alloy, or another suitable conductive material, for example.

In addition to coupling the gate electrode of control transistor 440 to control gate carrier segment 420e, gate electrode heat spreader 454 is configured to provide integrated heat spreading functionality for dissipation of heat generated by control transistor 440. Gate electrode heat spreader 454 provides the above functions without the need for a conductive clip including a leg portion, and without the need for a separate heat spreader.

In some implementations, gate electrode heat spreader 454 may be included within heat spreader array 412 of FIG. 4C. In such an implementation, gate electrode heat spreader 454 may be held together with power electrode heat spreader 450 using additional connecting bars. As such, gate electrode heat spreader 454 may be overlaid on conductive carrier array 414 of FIG. 4D substantially concurrently with power electrode heat spreader 450 such that gate electrode heat spreader 454 couples the gate electrode of control transistor 440 to control gate carrier segment 420e. Additionally, conductive adhesive 431 may be selectively applied to the gate of control transistor 440 and conductive adhesive 433 may be selectively applied to control gate carrier segment 420e during action 214 of FIG. 2.

In some implementations, gate electrode heat spreader 454 may be replaced with a wire bond, specifically if the current carrying capability and thermal dissipation requirements of gate electrode heat spreader 454 are low. The wire bond may include gold (Au) or Cu, for example. In other implementations, however, the wire bond may be replaced by conductive ribbons or other connectors formed form conductive materials such as Al, Au, Cu, and/or other metals or composite materials.

Control gate carrier segment 420e is configured to be electrically and mechanically coupled to gate electrode heat spreader 454 using conductive adhesive 433. Control gate carrier segment 420e is further configured to electrically couple the gate electrode of control transistor 440 to a substrate, for example.

Conductive adhesive 419, 421, 423, 425, 427, 429, 431, and 433 may include a conductive adhesive material, a solder paste, solder tape, solder, a silver filled adhesive such as QMI 529HT, a conductive sintered material, a diffusion bonded material, or another suitable attachment means. Conductive adhesive 419, 421, 423, 425, 427, 429, 431, and 433 may be formed to a thickness of at least 10 μm, for example.

Referring to FIG. 4H, power semiconductor package 401 includes power semiconductor package 418 of FIG. 4G after encapsulating power semiconductor package 418 in molding compound 492 and coupling power semiconductor package 418 to substrate 495. Power semiconductor package 401 of FIG. 4H includes power electrode heat spreader 450, gate electrode heat spreader 454, sync transistor 430, control transistor 440, power electrode carrier segment 420a, sync source carrier segment 420b, sync gate carrier segment 420c, control drain carrier segment 420d, control gate carrier segment 420e, conductive adhesive 419, conductive adhesive 421, and conductive adhesive 423, conductive adhesive 425, conductive adhesive 427, conductive adhesive 429, conductive adhesive 431, conductive adhesive 433, molding compound 492, and substrate 495. It should be noted that in some implementations, sync transistor 430 and control transistor 440 are implemented using the configurations of sync transistor 330 of FIG. 3A and control transistor 340 of FIG. 3B, respectively.

Substrate 495 includes a plurality of portions configured to electrically couple to the power electrodes and gate electrodes of power semiconductor package 401. Power electrode carrier segment 410a, sync source carrier segment 410b, sync gate carrier segment 420c, control drain carrier segment 420d, and control gate carrier segment 420e are electrically and mechanically coupled to substrate 495 using conductive pads, solder bodies, a conductive adhesive, or another suitable attachment means, for example. Substrate 495 may be a circuit board, for example a printed circuit board (PCB), or another suitable substrate.

Substrate 495 uses conductive traces or other conductive means to electrically couple the required components of power semiconductor package 401. For example, in one implementation, substrate 495 may include conductive traces to electrically couple each of the source electrodes, the gate electrodes, and the drain electrodes of sync transistor 330 and control transistor 440 according to voltage converter 100 of FIG. 1, for example. Molding compound 492 is configured to encapsulate power semiconductor package 401 to provide protection for power semiconductor package 401. Molding compound 492 may include any suitable molding compound or a plastic case.

In an implementation where sync transistor 430 has the configuration of sync transistor 330 of FIG. 3A, and control transistor 440 has the configuration of control transistor 340 of FIG. 3B, the combination of power electrode heat spreader 450 and power electrode carrier segment 420a couples the drain electrode of sync transistor 430 and the source electrode of control transistor 440 to substrate 495, sync source carrier segment 420b couples the source electrode of sync transistor 430 to substrate 495, sync gate carrier segment 420c couples the gate electrode of sync transistor 430 to substrate 495, control drain carrier segment 420d couples the drain electrode of control transistor 440 to substrate 495, and the combination of gate electrode heat spreader 454 and control gate carrier segment 420e couples the gate electrode of control transistor 440 to substrate 495.

It should be noted that in some implementations, although not specifically shown in the cross-sectional views provided, power semiconductor package 401 may further include driver IC 170. In such an implementation, power semiconductor package 401 may be configured to include each feature of MCM 102 electrically connected according to voltage converter 100 of FIG. 1.

Thus, utilizing a power electrode heat spreader implemented as a switch node and a gate electrode heat spreader to provide integrated heat spreading enables a highly compact MCM design, while concurrently providing thermal protection. For example, a power semiconductor package height, or thickness, resulting from the implementations disclosed in the present application may be less than approximately 0.5 mm, such as a power semiconductor package height or thickness of approximately 0.45 mm. In addition, use of the power electrode heat spreader to provide the switch node and the gate electrode heat spreader advantageously enables omission of a conductive clip having a support leg, or any other feature implemented solely as a switch node electrical connector, from the MCM. Furthermore, use of the array based fabrication approach of the present disclosure advantageously enables increased package fabrication efficiency and reduced package fabrication cost for MCM packages, while concurrently resulting in reduced parasitics and improved thermal performance.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method of fabricating a power semiconductor package, said method comprising:
providing a conductive carrier array including a plurality of power modules held together with connecting bars, wherein each of said plurality of power modules includes a control transistor, a sync transistor and a driver IC; and
overlying on said conductive carrier array a heat spreader array that includes a plurality of power electrode heat spreaders, and in each power module of said plurality of power modules:
a drain of said sync transistor is electrically coupled to a sync drain carrier segment, a source of said sync transistor is electrically coupled to a sync source carrier segment and a gate of said sync transistor is electrically coupled to a sync gate carrier segment;
a drain of said control transistor is electrically coupled to a control drain carrier segment, a source of said control transistor is electrically coupled to said drain of said sync transistor and a gate of said control transistor is electrically coupled to a control gate carrier segment, wherein said source and said gate of said control transistor are positioned on a top surface of said control transistor, and said drain of said control transistor is positioned on a bottom surface of said control transistor; and
a corresponding power electrode heat spreader has a contact surface and is mechanically coupled along said contact surface to said drain of said sync transistor, said sync drain carrier segment and said source of said control transistor;
wherein said connecting bars provide electrical connection for said source or said gate of said sync transistor and facilitate array-based fabrication of the power semiconductor package to increase fabrication efficiency and reduce fabrication cost.

2. The method of claim 1 further comprising:
selectively applying a conductive adhesive to segments of said conductive carrier array and in each power module to said source of said control transistor and said drain of said sync transistor.

3. The method of claim 1 further comprising:
in each power module, coupling said gate of said control transistor to said control gate carrier segment.

4. The method of claim 3, wherein said gate of said control transistor is coupled to said control gate carrier segment using a gate electrode heat spreader.

5. The method of claim 3, wherein said gate of said control transistor is coupled to said control gate carrier segment using a wire bond.

6. The method of claim 1 further comprising:
singulating said conductive carrier array and said heat spreader array to form said power semiconductor package.

7. The method of claim 1, wherein said driver IC is attached to a driver IC carrier segment.

8. The method of claim 1, wherein said sync transistor and said control transistor are selected from the group consisting of a FET, an IGBT, and a HEMT.

9. The method of claim 1, wherein said sync transistor and said control transistor are selected from the group consisting of a silicon FET and a GaN FET.

10. A method of fabricating a power semiconductor package, said method comprising:
providing a conductive carrier array including a plurality of power modules held together with connecting bars, wherein each of said plurality of power modules includes a control transistor, a sync transistor and a driver IC; and
overlying on said conductive carrier array a heat spreader array that includes a plurality of power electrode heat spreaders, and in each power module of said plurality of power modules:
said driver IC is electrically coupled to a driver IC carrier segment;
a drain of said sync transistor is electrically coupled to a sync drain carrier segment, a source of said sync transistor is electrically coupled to a sync source carrier segment and a gate of said sync transistor is electrically coupled to a sync gate carrier segment;
a drain of said control transistor is electrically coupled to a control drain carrier segment, a source of said control transistor is electrically coupled to said drain of said sync transistor and a gate of said control transistor is electrically coupled to a control gate carrier segment, wherein said source and said gate of said control transistor are positioned on a top surface of said control transistor, and said drain of said control transistor is positioned on a bottom surface of said control transistor; and
a corresponding power electrode heat spreader has a contact surface and is mechanically coupled along said contact surface to said drain of said sync transistor, said sync drain carrier segment and said source of said control transistor;
wherein said connecting bars provide electrical connection for said source or said gate of said sync transistor and facilitate array-based fabrication of the power semiconductor package to increase fabrication efficiency and reduce fabrication cost.

11. The method of claim 10 further comprising:
selectively applying a conductive adhesive to segments of said conductive carrier array and in each power module to said source of said control transistor and said drain of said sync transistor.

12. The method of claim 10 further comprising:
in each power module, coupling said gate of said control transistor to said control gate carrier segment.

13. The method of claim 12, wherein said gate of said control transistor is coupled to said control gate carrier segment using a gate electrode heat spreader.

14. The method of claim 10, wherein said sync transistor and said control transistor are selected from the group consisting of a FET, an IGBT, and a HEMT.

15. A power semiconductor package comprising:
- a sync transistor having a drain on a top surface of said sync transistor, and a source and a gate on a bottom surface of said sync transistor, wherein connecting bars provide electrical connection for said source or said gate of said sync transistor and facilitate array-based fabrication of the power semiconductor package to increase fabrication efficiency and reduce fabrication cost;
- wherein said drain of said sync transistor is electrically coupled to a sync drain carrier segment, said source of said sync transistor is electrically coupled to a sync source carrier segment and said gate of said sync transistor is electrically coupled to a sync gate carrier segment;
- a control transistor having a source and a gate on a top surface of said control transistor, and a drain on a bottom surface of said control transistor;
- wherein said drain of said control transistor is electrically coupled to a control drain carrier segment, said source of said control transistor is electrically coupled to said drain of said sync transistor and said gate of said control transistor is electrically coupled to a control gate carrier segment;
- a power electrode heat spreader that has a contact surface and that is mechanically coupled along said contact surface to said drain of said sync transistor, said sync drain carrier segment and said source of said control transistor.

16. The power semiconductor package of claim 15, further comprising a gate electrode heat spreader situated over said gate of said control transistor and configured for attachment to a gate electrode conductive carrier segment.

17. The power semiconductor package of claim 15, further comprising a wire bond coupling said gate of said control transistor to a gate electrode conductive carrier segment.

18. The power semiconductor package of claim 15, wherein said sync transistor and said control transistor are selected from the group consisting of a FET, an IGBT, and a HEMT.

19. The power semiconductor package of claim 15, wherein said sync transistor and said control transistor are selected from the group consisting of a silicon FET and a GaN FET.

20. The power semiconductor package of claim 15, wherein said control transistor and said sync transistor are part of a voltage converter.

* * * * *